(12) United States Patent
Hays

(10) Patent No.: US 7,609,574 B2
(45) Date of Patent: Oct. 27, 2009

(54) METHOD, APPARATUS AND SYSTEM FOR GLOBAL SHARED MEMORY USING SERIAL OPTICAL MEMORY

(75) Inventor: Kirk I. Hays, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 795 days.

(21) Appl. No.: 11/238,490

(22) Filed: Sep. 28, 2005

(65) Prior Publication Data

US 2007/0081785 A1    Apr. 12, 2007

(51) Int. Cl.
*G11C 13/04* (2006.01)
(52) U.S. Cl. .................. 365/215; 365/64; 365/73; 365/198
(58) Field of Classification Search .......... 365/64, 365/73, 215, 216, 198; 711/130, 141, 144
See application file for complete search history.

(56) References Cited

U.S. PATENT DOCUMENTS

| | | | | |
|---|---|---|---|---|
| 4,334,305 A | * | 6/1982 | Girardi | 370/359 |
| 5,287,316 A | * | 2/1994 | Urushidani et al. | 365/215 |
| 5,740,117 A | * | 4/1998 | Bona et al. | 365/215 |
| 6,453,393 B1 | * | 9/2002 | Holman et al. | 711/154 |
| 6,917,739 B2 | * | 7/2005 | Chen | 385/122 |
| 2006/0051101 A1 | * | 3/2006 | Vishkin | 398/164 |
| 2007/0071445 A1 | * | 3/2007 | Hays | 398/140 |

OTHER PUBLICATIONS

Thorson, M. "Multiprocessor cache coherency: MOESI model describes snooping protocols." Jun. 20, 1990. Microprocessor Report, v4, n11, p. 12(4).*

* cited by examiner

Primary Examiner—Tuan T Nguyen
Assistant Examiner—Alexander Sofocleous
(74) Attorney, Agent, or Firm—David L. Guglielmi

(57) ABSTRACT

In some embodiments, a method, apparatus and system for global shared memory using serial optical memory are presented. In this regard, a memory device is introduced to circulate a signal among a plurality of optical emitters and receivers. Other embodiments are also disclosed and claimed.

5 Claims, 2 Drawing Sheets

METHOD, APPARATUS AND SYSTEM FOR GLOBAL SHARED MEMORY USING SERIAL OPTICAL MEMORY

FIELD OF THE INVENTION

Embodiments of the present invention generally relate to the field of memory, and, more particularly to a method, apparatus and system for global shared memory using serial optical memory.

BACKGROUND OF THE INVENTION

Computing devices use memory to store data and instructions. Typically, memory devices have comprised arrays of capacitors or transistors where the capacity of the memory device is equal to the number of physical components present.

BRIEF DESCRIPTION OF THE DRAWINGS

The present invention is illustrated by way of example and not limitation in the figures of the accompanying drawings in which like references indicate similar elements, and in which.

DETAILED DESCRIPTION

In the following description, for purposes of explanation, numerous specific details are set forth in order to provide a thorough understanding of the invention. It will be apparent, however, to one skilled in the art that embodiments of the invention can be practiced without these specific details. In other instances, structures and devices are shown in block diagram form in order to avoid obscuring the invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1:
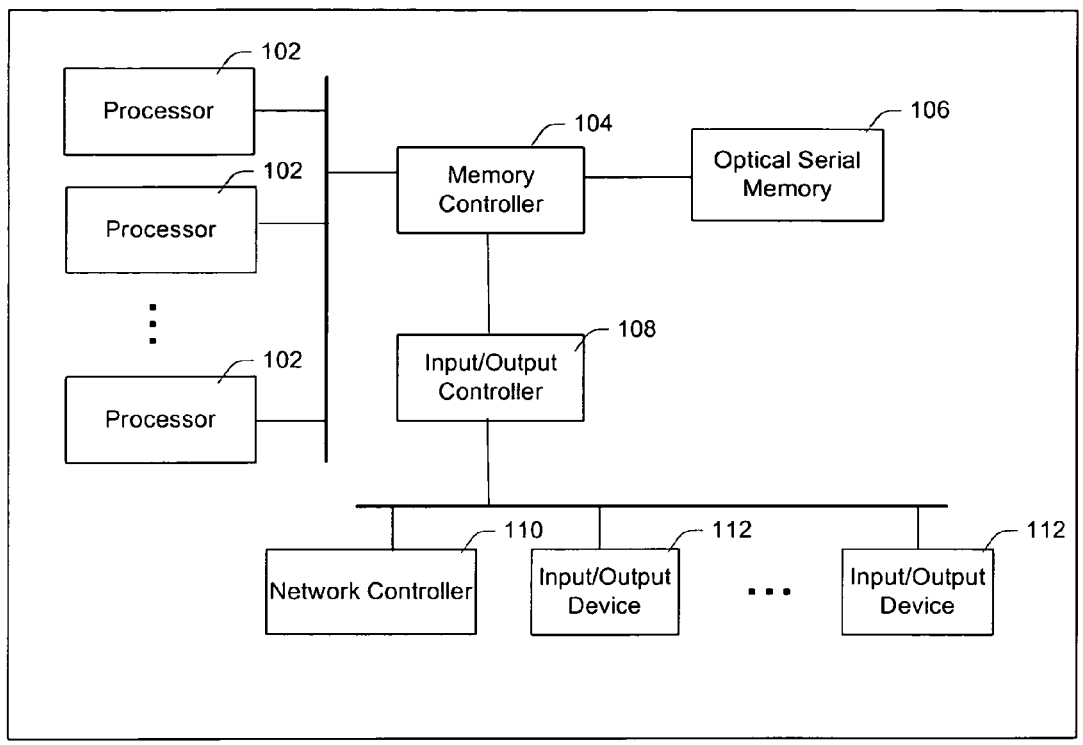
FIG. 1 is a block diagram of an example electronic appliance suitable for implementing an optical serial memory, in accordance with one example embodiment of the invention.

FIG. 1 is a block diagram of an example electronic appliance suitable for implementing an optical serial memory, in accordance with one example embodiment of the invention. Electronic appliance 100 is intended to represent any of a wide variety of traditional and non-traditional electronic appliances, laptops, desktops, cell phones, wireless communication subscriber units, wireless communication telephony infrastructure elements, personal digital assistants, set-top boxes, or any electric appliance that would benefit from the teachings of the present invention. In accordance with the illustrated example embodiment, electronic appliance 100 may include one or more of processor(s) 102, memory controller 104, optical serial memory 106, input/output controller 108, network controller 110, and input/output device(s) 112 coupled as shown in FIG. 1. Optical serial memory 106, as described more fully hereinafter, may well be used in electronic appliances of greater or lesser complexity than that depicted in FIG. 1.

Processor(s) 102 may represent any of a wide variety of control logic including, but not limited to one or more of a microprocessor, a programmable logic device (PLD), programmable logic array (PLA), application specific integrated circuit (ASIC), a microcontroller, and the like, although the present invention is not limited in this respect.

Memory controller 104 may represent any type of chipset or control logic that interfaces optical serial memory 106 with the other components of electronic appliance 100. In one embodiment, the connection between processor(s) 102 and memory controller 104 may be referred to as a front-side bus. In another embodiment, memory controller 104 may be referred to as a north bridge.

Optical serial memory 106 may have an architecture as described in greater detail with reference to FIG. 2. Optical serial memory 106 may replace or supplement any type of memory device(s) used to store data and instructions that may have been or will be used by processor(s) 102.

Input/output (I/O) controller 108 may represent any type of chipset or control logic that interfaces I/O device(s) 112 with the other components of electronic appliance 100. In one embodiment, I/O controller 108 may be referred to as a south bridge. In another embodiment, I/O controller 108 may comply with the Peripheral Component Interconnect (PCI) Express™ Base Specification, Revision 1.0a, PCI Special Interest Group, released Apr. 15, 2003.

Network controller 110 may represent any type of device that allows electronic appliance 100 to communicate with other electronic appliances or devices. In one embodiment, network controller 110 may comply with a The Institute of Electrical and Electronics Engineers, Inc. (IEEE) 802.11b standard (approved Sep. 16, 1999, supplement to ANSI/IEEE Std 802.11, 1999 Edition). In another embodiment, network controller 110 may be an Ethernet network interface card.

Input/output (I/O) device(s) 112 may represent any type of device, peripheral or component that provides input to or processes output from electronic appliance 100.

Figure 2:
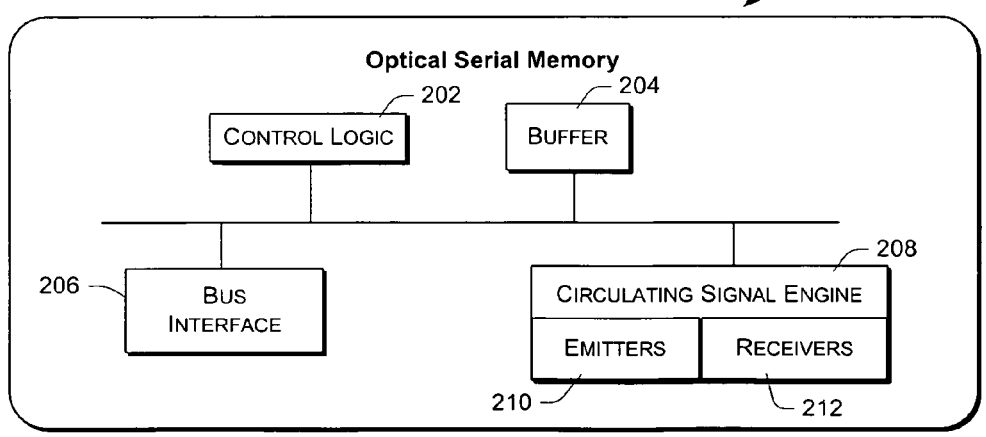
FIG. 2 is a block diagram of an example optical serial memory architecture, in accordance with one example embodiment of the invention.

FIG. 2 is a block diagram of an example optical serial memory architecture, in accordance with one example embodiment of the invention. As shown, optical serial memory 106 may include one or more of control logic 202, buffer 204, bus interface 206, and circulating signal engine 208 coupled as shown in FIG. 2. In accordance with one aspect of the present invention, to be developed more fully below, optical serial memory 106 may include a circulating signal engine 208 comprising emitters 210 and receivers 212. It is to be appreciated that, although depicted as a number of disparate functional blocks, one or more of elements 202-212 may well be combined into one or more multi-functional blocks. In this regard, optical serial memory 106 in general, and circulating signal engine 208 in particular, are merely illustrative of one example implementation of one aspect of the present invention.

Optical serial memory 106 may have the ability to store data by circulating a signal among a plurality of optical emitters and receivers. In one embodiment, optical serial memory 106 may encode an n-dimensional array into a serial signal. In another embodiment, optical serial memory 106 may encode a sparse array into a serial signal.

As used herein control logic 202 provides the logical interface between optical serial memory 106 and its host electronic appliance 100. In this regard, control logic 202 may manage one or more aspects of optical serial memory 106 to provide a communication interface to electronic appliance 100, e.g., through memory controller 104. Control logic 202 may also enable optical serial memory 106 to write data and read data from the circulating serial signal. In one embodiment, control logic 202 will encode data received from memory controller 104 into a serial packet including, for example, unit bit sequences as a packet header. In another embodiment, control logic 202 will decode a serial packet read from circulating signal engine 208 into data to be sent to memory controller 104.

Buffer 204 is intended to represent any of a wide variety of memory devices and/or systems known in the art. According to one example implementation, though the claims are not so limited, buffer 204 may well include volatile and non-volatile memory elements, possibly random access memory (RAM) and/or read only memory (ROM). Buffer 204 may be used to store portions of the circulating signal that are queued to be added to the serial signal, for example.

Bus interface 206 provides a path through which optical serial memory 106 can communicate with memory controller 104. Optical serial memory 106 utilizes this interface to receive data to be stored and to send data and commands needed by processor(s) 102, for example.

As introduced above, circulating signal engine 208 may be utilized by control logic 202 to circulate a serial signal through a chain of optical emitters and receivers. Emitters 210 and receivers 212 may be configured in pairs as depicted in greater detail with reference to FIG. 3.

Figure 3:
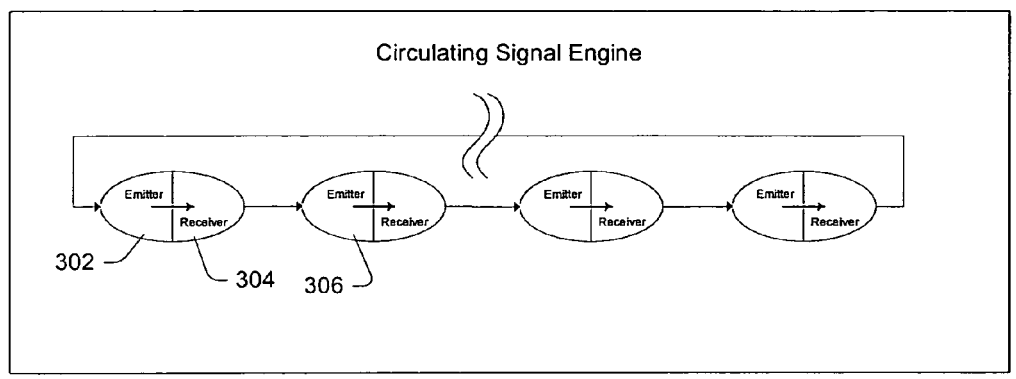
FIG. 3 is a block diagram of an example circulating signal engine, in accordance with one example embodiment of the invention.

FIG. 3 is a block diagram of an example circulating signal engine, in accordance with one example embodiment of the invention. Circulating signal engine 208 includes a plurality of optical emitters and optical receivers arranged in a loop pattern. As shown, the emitters and receivers are arranged in pairs such that emitters optically stimulate subsequent receivers and receivers electrically stimulate subsequent emitters.

Emitter 302 will propagate the serial signal optically to receiver 304, which will subsequently propagate the serial signal electrically to emitter 306, and so on. Depending on the speed with which the emitters and receivers are able to change state, it may be possible to have bits of information in flight between emitter 302 and receiver 304, for example, and/or between receiver 304 and emitter 306, for example. In one embodiment, there is a plurality of points, such as between receiver 304 and emitter 306, from which the circulating signal can be read and/or modified.

Figure 4:
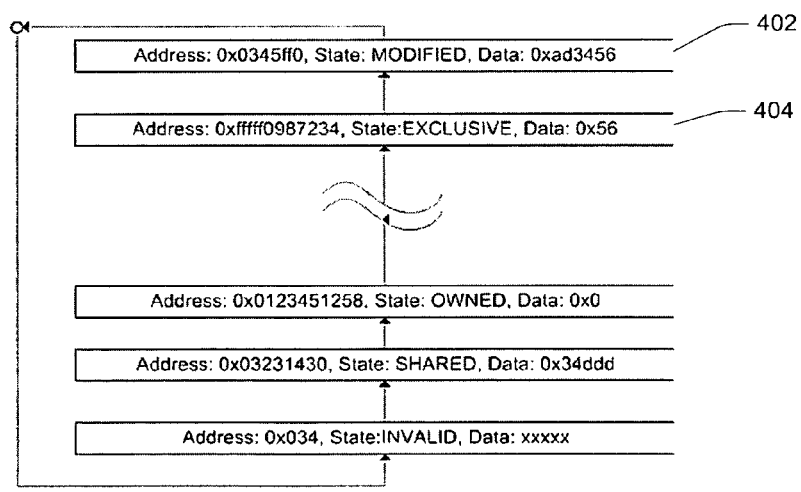
FIG. 4 is a block diagram of an example circulating signal, in accordance with one example embodiment of the invention.

FIG. 4 is a block diagram of an example circulating signal, in accordance with one example embodiment of the invention. Circulating signal 400 may contain N entries that have been packetized as shown. As part of the encoding process, each entry may be preceded by a unique bit sequence to indicate the beginning of the entry and/or each portion of the entry. In this respect, any known technique for serial communication may be utilized.

Entries 402 and 404 are two example entries in circulating signal 400. As sparse entries in an n-dimensional array, entries 402 and 404 are not adjacent elements of the same array. In this way, circulating signal 400 need only store data that is actually needed by processor(s) 102, and not large sections of data that may not be needed in their entirety.

Many of the methods are described in their most basic form but operations can be added to or deleted from any of the methods and information can be added or subtracted from any of the described messages without departing from the basic scope of the present invention. Any number of variations of the inventive concept is anticipated within the scope and spirit of the present invention. In this regard, the particular illustrated example embodiments are not provided to limit the invention but merely to illustrate it. Thus, the scope of the present invention is not to be determined by the specific examples provided above but only by the plain language of the following claims.

What is claimed is:

1. A method of storing data in a serial optical memory, the method comprising:

serially transmitting a signal among a plurality of optical emitters and receivers configured in a loop pattern without optical amplifiers, wherein the optical receivers propagate the signal electrically to adjacent optical emitters and wherein the optical emitters propagate the signal optically to adjacent optical receivers, wherein the signal comprises a globally shared signal.

2. The method of claim 1, wherein the signal further comprises a status.

3. The method of claim 2, wherein data can be added to and removed from the signal from more than one location.

4. An electronic appliance, comprising:

a processor to process data;

a network controller to communicate data; and a serial optical memory to store data coupled with the network controller and the processor, wherein the serial optical memory stores data by serially transmitting a signal through a chain of optical emitters and receivers without optical amplifiers, wherein the optical receivers propagate the signal electrically to adjacent optical emitters and wherein the optical emitters propagate the signal optically to adjacent optical receivers, and wherein the signal comprises a MOESI state.

5. The electronic appliance of claim 4, wherein data can be added to and removed from the signal from more than one location.

* * * * *